(12) United States Patent
Yamashita

(10) Patent No.: US 6,653,548 B2
(45) Date of Patent: Nov. 25, 2003

(54) THERMOELECTRIC CONVERSION MATERIAL, METHOD FOR MANUFACTURING SAME, AND THERMOELECTRIC CONVERSION ELEMENT

(75) Inventor: Osamu Yamashita, Ibaraki (JP)

(73) Assignee: Sumitomo Special Metals Co., Ltd., Osaka (JP)

( * ) Notice: Subject to any disclaimer, the term of this patent is extended or adjusted under 35 U.S.C. 154(b) by 0 days.

(21) Appl. No.: 09/974,595

(22) Filed: Oct. 10, 2001

(65) Prior Publication Data
US 2002/0069907 A1 Jun. 13, 2002

(30) Foreign Application Priority Data
Oct. 11, 2000 (JP) ........................................ 2000-310649

(51) Int. Cl.$^7$ ............................................. H01L 35/20
(52) U.S. Cl. ........................ 136/240; 136/201; 136/203; 136/205; 136/238; 136/239; 136/241; 419/48; 148/103; 252/62.57
(58) Field of Search ............................... 136/200, 201, 136/203, 236.1, 237–241, 205; 252/62.51 R–62.64; 419/48; 148/103

(56) References Cited
U.S. PATENT DOCUMENTS
6,274,802 B1 * 8/2001 Fukuda et al. .............. 136/201

OTHER PUBLICATIONS
Anno, H.; Tashiro, H.; Matsubara, K., "Transport Properties of CoSb/sub 3/ doped with magnetic impurities Fe and Ni", Thermoelectric, 1999. Eighteenth International Conference, Aug. 1999, pp. 169–172.*

Omerod, J., "Permanent magnet materials", Colloquim on New Permanent Magnet Materials and their Applications, 1989, pp. 1/1–1/5.* magnet and magnetism Britannica Student Encyclopedia <http://www/search.eb.com/ebi/article?eu=297597>; 2002 Encyclopedia Britannica Inc., 7 pgs.*

Warner, Jack, Magnetic Materials, Bulk, Dec. 4, 2000, Kirk–Othmer Encyclopedia of Chemical Technology Copyright 1995 by John Wiley & Sons, Inc. 49 pgs.*

* cited by examiner

Primary Examiner—Patrick Ryan
Assistant Examiner—Thomas H. Parsons
(74) Attorney, Agent, or Firm—Kilyk & Bowersox, P.L.L.C.

(57) ABSTRACT

A cuboid p-type and an n-type thermoelectric conversion material having a composite of an alloy powder for a rare earth magnet and a bismuth-based thermoelectric conversion material that has been rendered a p-type semiconductor or an n-type semiconductor by the addition of the required dopant, are arranged alternately with a material with low thermal conductivity and high electrical resistivity interposed between them. The low- and the high-temperature sides of these thermoelectric conversion materials are connected with wires, a magnetic field is applied in the x axis direction, a temperature gradient $\nabla T$ is imparted in the z axis direction a p-n junction is created, and thermoelectromotive force is extracted from the connection end in a plane in the y axis direction. There is a marked increase in the Seebeck coefficient even though no magnetic field is applied externally.

16 Claims, 3 Drawing Sheets

THERMOELECTRIC CONVERSION MATERIAL, METHOD FOR MANUFACTURING SAME, AND THERMOELECTRIC CONVERSION ELEMENT

BACKGROUND OF THE INVENTION

1. Field of the invention

The present invention relates to a thermoelectric conversion material composed of a composite of a novel bismuth-based thermoelectric conversion material and a permanent magnet material, which can be used in thermoelectric conversion elements and Peltier elements, and also relates to a thermoelectric (electrothermal) conversion element that makes use of this material and to a method for manufacturing this material.

2. Description of the Related Art

Thermoelectric conversion elements are devices that hold much promise for application in today's industrial fields because of their efficient use of thermal energy. An extremely broad range of potential applications have been studied, such as in systems that use waste heat and convert it into electrical energy, small, portable power generators used to obtain electricity outdoors in a simple manner, flame sensors for gas devices, and so forth.

Known structures for thermoelectric conversion elements include one in which thermoelectric conversion materials exhibiting p- and n-type conduction are directly joined into an element by powder metallurgy, and one in which thermoelectric conversion materials exhibiting p- and n-type conduction are joined at a p-n junction with a metal such as silver solder.

Known thermoelectric conversion materials for forming such elements include $IrSb_3$, $Bi_2Te_3$, PbTe, and other such high-performance chalcogen compounds, as well as $FeSi_2$, SiGe, and other such suicides, which have a low thermoelectric figure of merit, but are found in abundance in nature.

It is well known that a thermoelectric conversion element converts heat into electricity by providing a temperature gradient between p- and n-type thermoelectric conversion materials, but that, conversely, it can also function as an electrothermal conversion element (that is, a Peltier element) that converts electricity into heat when voltage is applied to the above materials.

A conventional thermoelectric conversion element generates thermoelectromotive force (heat energy) by utilizing a temperature gradient (potential differential) imparted to materials, but the thermoelectric figure of merit ($ZT=S^2/\rho K$; where S is the Seebeck coefficient, $\rho$ is the electrical resistivity, and $\kappa$ is the thermal conductivity) of a thermoelectric (electrothermal) conversion element is only about 1 at best, which falls short of being satisfactory.

The conversion efficiency of a thermoelectric conversion element is far lower than that of a solar cell (about 20%), for example, topping out at just a few percent, and this is the main reason for the delay in the practical application of thermoelectric (electrothermal) conversion elements.

Meanwhile, the generation of an electrical field when a magnetic field is applied to thermoelectric conversion materials with a temperature gradient is known as the Nernst effect (L. D. Landau, E. M. Lifslitz, and L. P. Pitaevskli, "Electrodynamics of Continuous Media," 2nd Edition, Pergamon Press, p. 101 (1984)).

With conventional thermoelectric conversion elements, though, the proposed structure was one in which a magnetic field was applied in order to increase efficiency in the conversion of the heat of a material into electricity, but this conversion efficiency was extremely low because of the low Seebeck coefficient of the thermoelectric conversion material.

SUMMARY OF THE INVENTION

It is an object of the present invention to provide a thermoelectric conversion material, and a thermoelectric conversion element that makes use of this material, which allow the Seebeck effect and the Nernst effect to be utilized synergistically, have a high Seebeck coefficient, and afford greater thermoelectromotive force.

As a result of various investigations aimed at achieving the stated object, the inventors found that the Seebeck effect and the Nernst effect can be utilized synergistically, and the Seebeck coefficient can be greatly increased, by mixing a bismuth-based thermoelectric conversion material containing one or more of the required dopants in an amount of no more than 5 at % in the bismuth, and a permanent magnet material such as an alloy powder for a rare earth magnet, and then applying a magnetic field to the compounded thermoelectric conversion material to magnetize the material itself.

The inventors perfected the invention upon discovering that a thermoelectric conversion element with a markedly higher Seebeck coefficient can be obtained by imparting a temperature gradient $\nabla T$ in the direction (z axis direction) perpendicular to the magnetization direction (x axis direction) of the above-mentioned thermoelectric conversion material, attaching an electrode material on the high- and low-temperature sides in a plane in the direction (y axis direction) perpendicular to the above two directions, creating a p-n junction, and extracting thermoelectromotive force from the connection end.

Specifically, the present invention is a thermoelectric conversion material that has a coercive force $H_{cJ}$ of at least 79.6 kA/m, wherein this material is a composite of a thermoelectric conversion material and a permanent magnet material, and more particularly one in which the thermoelectric conversion material is a bismuth-based thermoelectric conversion material containing one or more dopants in an amount of no more than 5 at % in the bismuth.

The above-mentioned thermoelectric conversion material is constituted such that the bismuth-based thermoelectric conversion material is a material that exhibits n-type conduction and contains at least one type of group VI element, rare earth element, alkali metal element, or alkaline earth element in an amount of no more than 5 at % in the bismuth, or p-type conduction and contains at least one type of transition metal element, group III element, or group IV element in an amount of no more than 5 at % in the bismuth, or is constituted such that the permanent magnet material, and particularly the alloy powder for a rare earth magnet, is an R—Fe—B-based alloy powder, an R—Fe—N-based allow powder, or an R—Co-based alloy powder and its average particle diameter is 5 to 500 $\mu$m.

Further, the present invention is a thermoelectric conversion element comprising means for applying a magnetic field in the required direction (x axis direction) of a thermoelectric conversion material, and thereby magnetizing this material; means for imparting a temperature gradient $\nabla T$ in the direction (z axis direction) perpendicular to the magnetization direction; and means for attaching an electrode material on the high- and low-temperature sides in a plane in the direction (y axis direction) perpendicular to the above two directions, creating a p-n junction, and extracting thermoelectromotive force from the connection end.

Further, the present invention is a method for manufacturing a thermoelectric conversion material, comprising the steps of mixing an alloy powder for a rare earth magnet with a bismuth-based thermoelectric conversion material containing one or more dopants in an amount of no more than 5 at % in the bismuth; and compounding this mixed powder by hot compression molding. More particularly, it is a method for manufacturing a thermoelectric conversion material constituted such that the hot compression molding is carried out in a magnetic field, or constituted such that the hot compression molding is hot pressing or discharge plasma sintering.

The thermoelectric conversion element pertaining to the present invention synergistically utilizes the Seebeck effect and the Nernst effect, resulting in a higher Seebeck coefficient and a greater thermoelectromotive force.

When the present invention constitutes a thermoelectric conversion element, there is no need for a device for applying an external magnetic field as in the past, which makes the thermoelectric conversion element itself more compact and lighter in weight, and also makes the element maintenance-free.

BRIEF DESCRIPTION OF THE DRAWINGS

FIG. 1A is an oblique view of the thermoelectric conversion material pertaining to the present invention, illustrating a method for using the material, while

FIG. 2A is a plan view of another structural example of the thermoelectric conversion element pertaining to the present invention, while

DESCRIPTION OF THE PREFERRED EMBODIMENTS

Figure 1A:
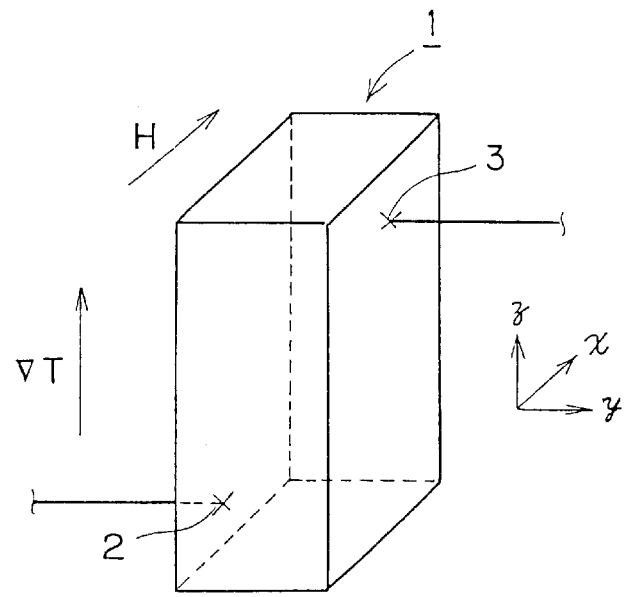

The thermoelectric conversion material pertaining to the present invention is composed of a composite of a bismuth-based thermoelectric conversion material and a permanent magnet material, and because the material itself is a kind of magnet having a coercive force, there is no need to apply a magnetic field from the outside, and because the carrier concentration can be varied by means of the various dopants added to the bismuth-based thermoelectric conversion material, the Nernst effect can be enhanced at the specified carried concentration.

Also, the performance index is higher because the electrical resistivity is at least one order of magnitude lower than that of materials based on $Bi_2Te_3$, Si—Ge, or Fe—Si known in the past. Therefore, when this material is used as a Peltier element, it becomes an electrothermal conversion material with a good cooling effect at low current, and also exhibits a high performance index when used as a thermoelectric conversion material.

In the present invention, the bismuth-based thermoelectric conversion material contains one or more dopants in an amount of no more than 5 at % in the bismuth; when at least one type of group VI element, rare earth element, alkali metal element, or alkaline earth element is contained in an amount of no more than 5 at % as a dopant, the material will exhibit n-type conduction, and when at least one type of transition metal element, group III element, or group IV element is contained in an amount of no more than 5 at %, the material will exhibit p-type conduction.

At least one type of the above-mentioned dopants must be contained in an amount of at least 0.01 at % in order for the material to become a semiconductor having the desired polarity. On the other hand, it is undesirable for the amount to be over 5 at % because there will be almost no increase in carrier concentration, and conversely the impurity effect will increase electrical resistance. A preferred content is 2 to 3 at %, and when two or more dopants are contained, the total amount should be 3 to 4 at %.

With the dopants used to obtain a material that exhibits n-type conduction, the group VI element is preferably S, Se, or Te; the rare earth element is preferably La, Ce, Pr, Nd, Sm, Eu, Gd, Tb, or Dy; the alkali metal element is preferably Li, Na, or K; and the alkaline earth element is preferably Be, Mg, Ca, Sr, or Ba.

With the dopants used to obtain a material that exhibits p-type conduction, the transition metal element is preferably Ti, V, Cr, Mn, Fe, Co, Ni, Cu, or Zn; the group III element is preferably B, Al, Ge, or In; and the group IV element is preferably C, Si, Ce, Sn, or Pb.

With the present invention, an alloy powder for a rare earth magnet is particularly suitable as the permanent magnet material, and it is favorable to use an R—Fe—B-based anisotropic alloy powder obtained by subjecting an R—Fe—B-based alloy to a hydrogenation treatment (HDDR process), an R—Fe—N-based anisotropic alloy powder obtained by the nitriding of an R—Fe alloy, an Sm—Co-based anisotropic alloy powder, or the like. The use of these rare earth magnet alloy powders yields a thermoelectric conversion material having a coercive force $H_{cJ}$ of at least 79.6 kA/m (1 kOe).

It is undesirable for the rare earth magnet alloy powder to have an average particle diameter of less than 5 μm because the powder will be prone to oxidation, and the effect of a demagnetizing field will greatly diminish the magnetization of the thermoelectric conversion material. It is also undesirable for 500 μm to be exceeded, though, since the magnetic field will tend to be uneven within the thermoelectric conversion material. The average particular size is therefore preferably 5 to 500 μm.

Because the bismuth used in the bismuth-based thermoelectric conversion material has a low melting point of 544 K, the bismuth-based thermoelectric conversion material fluidizes at a relatively low temperature, so hot compression molding such as hot pressing or discharged plasma sintering can be used as the means for compounding the above-mentioned bismuth-based thermoelectric conversion material with the rare earth magnet alloy powder. Specifically, a method that can be employed is to mix a bismuth-based thermoelectric conversion material with a rare earth magnet alloy powder, and then compound this mixed powder by hot compression molding. Because of the low melting point of bismuth as mentioned above, a particular advantage to this method is that it minimizes degradation of the magnetic characteristics of the alloy powder due to the reaction of the bismuth with the rare earth magnet alloy powder.

In this molding, as in the magnetic field molding commonly employed in the manufacture of anisotropic permanent magnets, it is preferable to apply a magnetic field to the alloy powder prior to compression, so that the compression molding is carried out with the easy axis of easy magnetization of the alloy powder consisted of single crystal. This affords greater magnetization of the resulting thermoelectric conversion element itself, and allows the thermoelectric conversion efficiency to be raised.

In the above-mentioned compounding, the bismuth-based thermoelectric conversion material must be continuously linked within the molded compound material. Specifically, if the amount of rare earth magnet alloy powder in the mixture is too large, there will be no such linking of the bismuth-based thermoelectric conversion material within the compound material, creating the problem of higher electrical resistance in the compound. Therefore, the mixing ratio of the rare earth magnet alloy powder and the bismuth-based thermoelectric conversion material should be such that the rare earth magnet alloy powder accounts for 20 to 60% out of the total weight of 100%. The above-mentioned problem will be encountered if 60% is exceeded, and the magnetic field strength (coercive force) will be inadequate at less than 20%.

The thermal conductivity of the rare earth magnet alloy powder at room temperature is approximately 10 W/mK, which is close to the thermal conductivity of the bismuth-based thermoelectric conversion material (8.5 W/mK), so there will be extremely little change in the thermal conductivity of the compound of the bismuth-based thermoelectric conversion material and the rare earth magnet alloy powder. Another advantage is that since this compounding increases the disturbance of phonons, there is a decrease in the thermal conductivity of the compound material.

The mixing of powdered materials was given above as an example of the compounding of a bismuth-based thermoelectric conversion material and a rare earth magnet alloy powder, but another possible configuration is one in which a cubic or plate-form rare earth magnet material magnetized in the required direction is used as a core, and a bismuth-based thermoelectric conversion material is integrally disposed around this in the required thickness, for example.

Figure 1B:
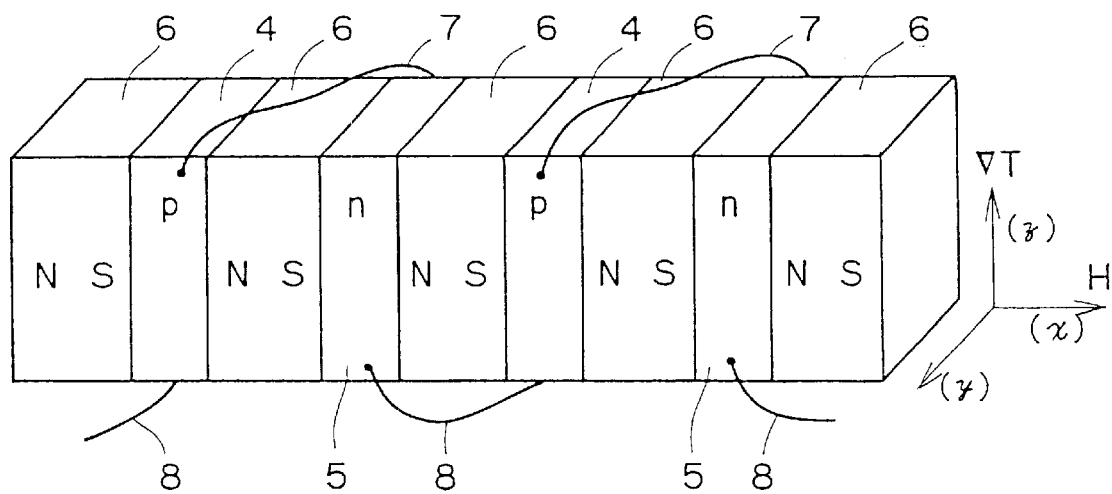
FIG. 1B is an oblique view illustrating a structural example of the thermoelectric conversion element pertaining to the present invention.

The constitution of the thermoelectric conversion element pertaining to the present invention will now be described. FIG. 1 illustrates a thermoelectric conversion element that makes use of the thermoelectric conversion material of the present invention. FIG. 1A is an oblique view of how the thermoelectric conversion material is used, while FIG. 1B is an oblique view illustrating a structural example of the thermoelectric conversion element. In the drawings, 1 is a thermoelectric conversion material, 2 and 3 are electrodes, 4 is a p-type thermoelectric conversion material, 5 is an n-type thermoelectric conversion material, 6 is a glass sheet, and 7 and 8 are wires.

The thermoelectric conversion material 1 shown in FIG. 1A, which consists of a compound of a cubic bismuth-based thermoelectric conversion material and a rare earth magnet alloy powder, is first magnetized by applying a magnetic field in the direction indicated by H in the drawing (the x axis direction). Let us assume that this material has then been placed over a heat source. This imparts a temperature gradient $\nabla T$ in the z axis direction, which is from down to up in the drawings. At the two end faces of the thermoelectric conversion material 1 in the y axis direction (on the left and right in the drawing, perpendicular to the temperature gradient $\nabla T$ direction and the magnetization direction), the electrodes 2 and 3 are provided on the side with a high temperature T (the lower side of the left face of the thermoelectric conversion material 1) and the side with a low temperature T so as to create a temperature differential between the positive electrode 2 and the negative electrode 3. A lead is connected to each electrode so that a thermoelectromotive force can be extracted.

Specifically, the thermoelectric conversion element pertaining to the present invention comprises means for applying a magnetic field in the required direction (x axis direction) of the thermoelectric conversion material and thereby magnetizing this material, means for imparting a temperature gradient $\nabla T$ in the direction (z axis direction) perpendicular to the magnetization direction, and means for attaching an electrode material on the high- and low-temperature sides in a plane in the direction (y axis direction) perpendicular to the above two directions, creating a p-n junction as shown in FIG. 1B, and extracting a thermoelectromotive force from the connection end. This markedly raises the Seebeck coefficient even though no magnetic field is applied externally.

The thermoelectric conversion element in FIG. 1B illustrates an example of the structure of a thermoelectric conversion element featuring more than one type of thermoelectric conversion material, wherein the required dopant is added to the bismuth-based thermoelectric conversion material that constitutes the thermoelectric conversion element of the present invention, thereby creating a material that exhibits p- or n-type conduction. Using the structure shown in FIG. 1A and discussed above as a basis, a p-type thermoelectric conversion material 4 and an n-type thermoelectric conversion material 5 are alternately arranged, separated by a material with low thermal conductivity and high electrical resistivity, such as a glass sheet 6. The low-temperature sides of the thermoelectric conversion materials are connected by wires 7, and the high-temperature sides by wires 8.

In this invention, a large electromotive force will not be obtained if the temperature difference between the electrodes is too small, because only a tunneling effect will result from the magnetization of the compounded thermoelectric conversion material itself. Therefore, the temperature difference between the electrodes should be at least 1K, and the Seebeck coefficient is markedly enhanced by the synergistic effect between the Seebeck effect and the Nernst effect. There will be virtually no additional benefit to having the temperature difference beyond 5K. A preferred temperature is 323 to 373K, but the effect produced by the magnetization of the thermoelectric conversion material will be sufficiently realized even at about 473K. Because the melting point of a bismuth-based thermoelectric conversion material is relatively low, even an Nd—Fe—B-based alloy powder with a low Curie point (about 650K) can be accommodated.

Basically any material or configuration can be employed for the electrodes, and any material can also be used for the leads. Still, an electrode that has excellent corrosion resistance and is easy to bond to the thermoelectric conversion material is preferable. Also, because the melting point of the bismuth-based thermoelectric conversion material in the present invention is relatively low (about 600K), the use of a material with a low melting point as the electrode material is preferred. The leads connected to the electrodes can also be selected as needed, and there is no particular problem if the electrodes and the leads are made of the same materials, as with wire bonding.

The use of different electrode materials on the high- and low-temperature sides allows the thermoelectric conversion efficiency to be increased even if the temperature gradient $\nabla T$ is relatively small. One or more of Ag, Pt, Cu, Ti, In, Pb, Sn, Bi, and alloys of these can be used favorably as the electrode material on the high-temperature side, while one or more of Cu, Pt, Al, Au, Fe, Mo, Zn, In, Pb, Sn, Bi, and alloys of these can be used on the low-temperature side, as long as the material is different from that on the high-temperature side. The alloys of these elements referred to here encompass not only metals within the listed groups, but also alloys of metals within these groups with metals from other groups.

There are no particular restrictions on the magnetic characteristics of the thermoelectric conversion material in the present invention, but it is preferable if the coercive force $H_{cJ}$ is at least 79.6 A/m (1 kOe), as a synergistic effect will be obtained between the Seebeck effect and Nernst effect. 238.8 A/m (1 kOe) or higher is particularly favorable.

Because the thermoelectric conversion material itself is magnetized in the present invention, there is no need to apply a magnetic field externally. Therefore, the apparatus conventionally used for applying an external magnetic field is unnecessary, making the thermoelectric conversion element itself more compact and lighter in weight. Also, since a large magnetic field is applied to the bismuth-based thermoelectric conversion material in the vicinity of the rare earth magnet alloy powder, the Nernst effect should be greater, albeit locally.

In the present invention, there is no particular need for the temperature gradient ∇T imparting means to impart a large temperature difference as mentioned above, so a standard method can be selected for imparting this difference, such as heating or cooling one of the thermoelectric conversion materials, or bringing it into contact with a heating or cooling source. This method can be suitably selected along with the thermoelectric conversion module production discussed below.

As to the means for imparting a potential difference when the thermoelectric conversion element pertaining to the present invention is used as a cooling Peltier element, because this element has electrical resistivity on the order of $10^{-6}$ Ωm on its own, an advantage is that a large current can be obtained at a low voltage, and it is possible to produce a module of Peltier elements with a high cooling efficiency at a low potential.

Figure 2A:
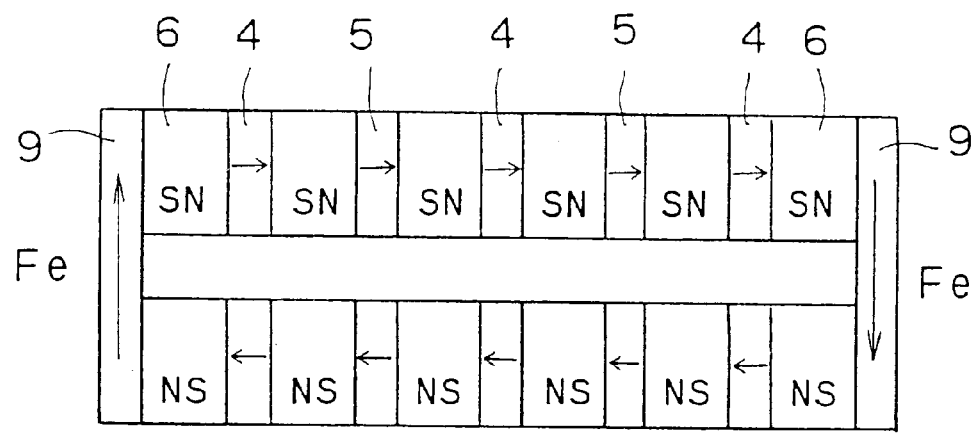
Figure 2B:
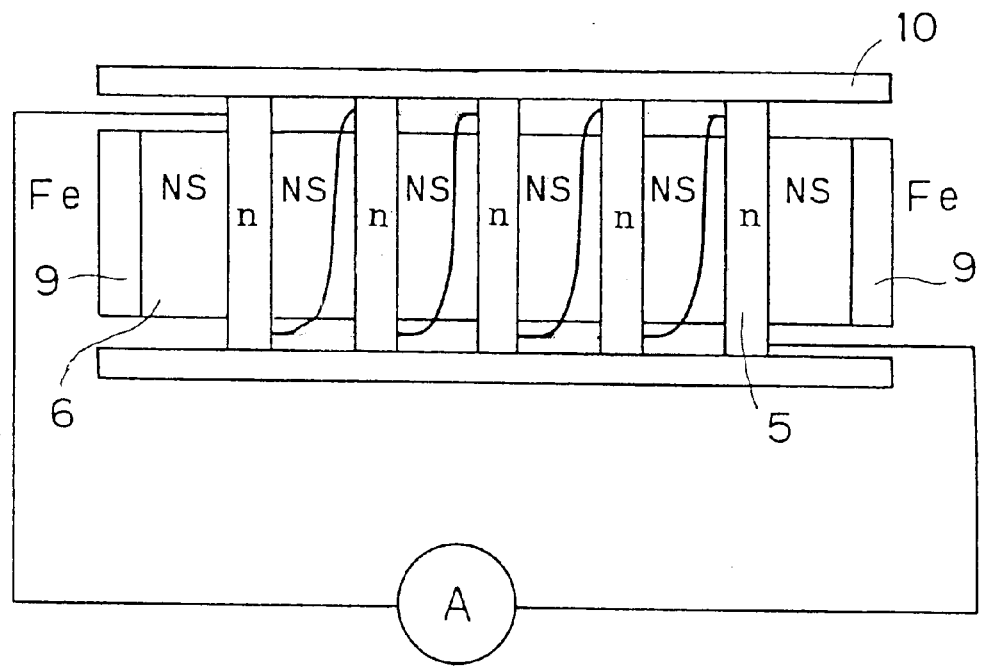
FIG. 2B is a front view of another structural example of the thermoelectric conversion element pertaining to the present invention.

The structure of a module of thermoelectric conversion elements pertaining to the present invention will now be described. FIGS. 2A and 2B are diagrams illustrating a structural example of a module of the thermoelectric conversion elements pertaining to the present invention. In the drawings, 9 is a magnetic plate and 10 is a heating plate. Those components that are the same as in FIG. 1 discussed above are numbered the same.

The thermoelectric conversion element shown in FIG. 2A is an example of a closed magnetic circuit in which the thermoelectric conversion element pertaining to the present invention is used. The required dopants are added to the bismuth-based thermoelectric conversion material that constitutes the thermoelectric conversion element of the present invention to produce a p-type thermoelectric conversion material 4 and an n-type thermoelectric conversion material 5, the resulting thermoelectric conversion materials are arranged alternately, separated by a material with low thermal conductivity and high electrical resistivity, such as a glass sheet 6, and the thermoelectric conversion materials 4 and 5 are connected at the two ends of each block with magnetic plates 9 made of iron or the like, thereby configuring a closed magnetic circuit.

The thermoelectric conversion element shown in FIG. 2B is based on the structure shown in FIG. 2A, but only the n-type thermoelectric conversion material 5 is used as the thermoelectric conversion material, and the element is designed such that this n-type thermoelectric conversion material 5 is longer than the glass sheets 6 in the direction of the temperature gradient, and this material is in direct contact with a cooling or heating plate 10 so that there is no thermal conduction through the glass sheets 6.

Employing these structures allows a temperature difference (or a potential difference in the case of a Peltier element) to be automatically imparted between the electrodes of the thermoelectric conversion materials. In this case, the thermoelectric conversion materials are preferably in the form of rectangles or rods as shown in FIGS. 2A and 2B.

The thermoelectric conversion materials are connected by the following methods in the above structures. When p- and n-type thermoelectric conversion materials are used in pairs, the direction of the wires (leads) is triaxial as shown in FIG. 1B, and in the case of the p-type thermoelectric conversion material 4 on the left end in the drawing, for example, the wires 8 on the low-temperature side are connected on the lower side of the rear face in the drawing, while the wires 7 on the high-temperature side are connected on the upper side on the front face, with the other ends being connected on the same temperature side of the adjacent n-type thermoelectric conversion material 5 via a glass sheet. When just a p- or n-type thermoelectric conversion material is used, the materials are alternately connected from the high-temperature side to the low-temperature side as shown in FIG. 2B.

Figure 3A:
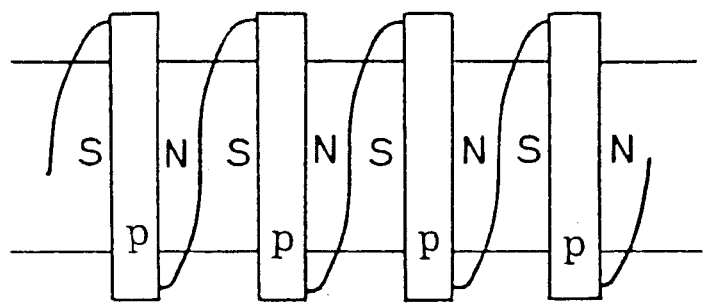
FIG. 3 consists of diagrams illustrating how the wires are connected with the thermoelectric conversion element pertaining to the present invention, with FIG. 3A illustrating a structure comprising just p-type or just n-type conduction, and FIG. 3B illustrating the use of paired p- and n-types.
Figure 3B:
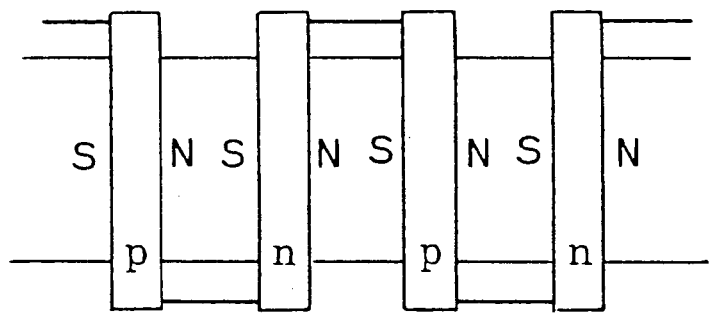

FIGS. 3A and 3B are simplified diagrams illustrating examples of the connection of the thermoelectric conversion materials. When just a p- or n-type thermoelectric conversion material is used, the high-temperature side and the low-temperature side are alternately connected as shown in FIG. 3A, and when p- and n-type thermoelectric conversion materials are used in pairs, the p- and n-type low-temperature sides and high-temperature sides are connected as shown in FIG. 3B.

EXAMPLES

Example 1

In order to produce the thermoelectric conversion material of the present invention composed of n-type conduction and p-type conduction semiconductors, the elements shown in Table 1 were added in the given amounts to high-purity bismuth (4N), after which the mixture was vacuum sealed in a quartz tube and melted by vacuum induction method. The cylindrical ingots of bismuth-based thermoelectric conversion material thus obtained were cut into a size of 10×10×1 mm, after which the Hall coefficient was measured in order to confirm the polarity and carrier concentration. Table 2 shows the results of measuring the carrier concentration, polarity, and electrical resistivity.

Next, the various cylindrical ingots obtained above were pulverized to produce bismuth-based thermoelectric conversion material powders, and each of these powders was mixed in the ratio shown in Table 3 with an R—Fe—B-based anisotropic alloy powder having a residual magnetic flux density (Br) of 1.23 T, a coercive force ($H_{cJ}$) of 1.18 MA/m, and an average particle size of 115 μm, after which this mixture was hot press molded in a magnetic field of 1.10 MA/m at a temperature of 773K and a pressure of 49 MPa, which yielded a thermoelectric conversion material composed of a composite of a bismuth-based thermoelectric conversion material and a rare earth magnet alloy powder.

The thermoelectric conversion material thus obtained was cut to a size of 5 mm (direction a)×5 mm (direction b)×10 mm (direction c) and magnetized with a magnetizer, after which the Seebeck coefficient and Seebeck current were measured, and the output voltage was calculated. The measurement results are given in Table 3.

The Seebeck coefficient and Seebeck current were measured by measuring the voltage of copper wire indium-soldered at both ends of the thermoelectric conversion material, with the average temperature of the high and low temperature portions held at a constant 323K and the temperature difference held at a constant 5K. The thermoelectric conversion material was magnetized by applying a pulse magnetic field of 40 kOe. The magnetic characteristics of the magnetized thermoelectric conversion material included a residual magnetic flux density Br of 0.43 T and a coercive force ($H_{cJ}$) of 1.09 MA/m (sample No. 3).

The residual magnetic flux density Br varies with the mixing ratio of the R—Fe—B-based anisotropic alloy powder, but it was found that the coercive force $H_{cJ}$ was virtually unaffected by the mixing ratio. The generated power is also shown in Table 3, which was determined by measuring the current ($\mu$A/K) and voltage ($\mu$V/K) per unit of temperature, and assuming that of sample No. 1 (a comparative example; containing no R—Fe—B-based anisotropic alloy powder) to be 1.

TABLE 1

| No. | Composition (at %) Bi | Dopant | Added amount (at %) |
|---|---|---|---|
| A | 100 | — | 0.0 |
| B | 100 | Ga | 0.5 |
| C | 100 | Ga | 5.0 |
| D | 100 | In | 11.0 |
| E | 100 | S | 1.5 |

TABLE 2

| No. | Carrier concentration (l/m$^3$) | Electrical resistivity ($\Omega$m) | Polarity |
|---|---|---|---|
| A | 3.0 × 10$^{25}$ | 1.2 × 10$^{-6}$ | n |
| B | 7.8 × 10$^{24}$ | 2.2 × 10$^{-6}$ | n |
| C | 3.4 × 10$^{24}$ | 4.6 × 10$^{-6}$ | p |
| D | 3.8 × 10$^{23}$ | 4.3 × 10$^{-6}$ | n |
| E | 4.8 × 10$^{25}$ | 8.7 × 10$^{-7}$ | n |

Example 2

To examine the Peltier effect of the bismuth-based thermoelectric conversion material of the present invention, a 2-amp current was sent in direction b (5 mm direction) of the sample of Example 1, and the top surface temperature in direction b after 10 seconds (decrease temperature) was measured. The results are given in Table 4.

The proportional decrease in temperature is given as the proportion when the decrease temperature of sample No. 1 (a comparative example; containing no R—Fe—B-based anisotropic alloy powder) is assumed to be 1.

TABLE 4

| | | Mixing ratio (wt %) | | | |
|---|---|---|---|---|---|
| No. | Thermo-electric conversion material | Thermo-electric conversion material | Rare earth magnet alloy powder | Decrease temperature (after 10 seconds; ° C.) | Proportional decrease in temperature |
| 1 | A | 100 | 0 | 0.8 | 1 |
| 2 | A | 80 | 20 | 1.6 | 2 |
| 3 | A | 60 | 40 | 2.0 | 2.5 |
| 4 | A | 35 | 65 | 0.5 | 0.6 |
| 5 | B | 80 | 20 | 3.2 | 4 |
| 6 | C | 80 | 20 | 4.5 | 5.6 |
| 7 | D | 80 | 20 | 0.4 | 0.5 |
| 8 | E | 80 | 20 | 5.1 | 6.4 |

What is claimed is:

1. A bismuth-based thermoelectric conversion material that has a coercive force $H_{cJ}$ of at least 79.6 kA/m.

2. A thermoelectric conversion material that is a composite of a thermoelectric conversion material and a permanent magnet material and has a coercive force $H_{cJ}$ of at least 79.6kA/m.

3. A thermoelectric conversion material that is a composite of an alloy powder for a rare earth magnet, and a bismuth-based thermoelectric conversion material containing one or more dopants in an amount of no more than 5 at % in the bismuth.

4. The thermoelectric conversion material according to claim 3, wherein the bismuth-based thermoelectric conversion material is a material that exhibits n-type conduction and contains at least one type of group VI element, rare earth element, alkali metal element, or alkaline earth element in an amount of no more than 5 at % in the bismuth.

5. The thermoelectric conversion material according to claim 3, wherein the bismuth-based thermoelectric conver-

TABLE 3

| No. | Thermo-electric conversion material | Mixing Ratio (wt %) Thermo-electric conversion material | Rare earth magnet alloy powder | Seebeck coefficient (m V/K) | Seebeck current ($\mu$A/K) | Output current (10$^{-12}$W/K$^2$) | Current ratio |
|---|---|---|---|---|---|---|---|
| 1 | A | 100 | 0 | 0.087 | 0.82 | 71 | 1 |
| 2 | A | 80 | 20 | 0.134 | 1.16 | 155 | 2.2 |
| 3 | A | 60 | 40 | 0.153 | 1.24 | 190 | 2.7 |
| 4 | A | 35 | 65 | 0.096 | 0.45 | 43 | 0.6 |
| 5 | B | 80 | 20 | 0.202 | 1.53 | 309 | 4.4 |
| 6 | C | 80 | 20 | 0.243 | 1.80 | 437 | 6.2 |
| 7 | D | 80 | 20 | 0.063 | 0.60 | 38 | 0.5 |
| 8 | E | 80 | 20 | 0.257 | 1.94 | 499 | 7.0 | sion material is a material that exhibits p-type conduction and contains at least one type of transition metal element, group III element, or group IV element in an amount of no more than 5 at % in the bismuth.

6. The thermoelectric conversion material according to claim 3, wherein the alloy powder for a rare earth magnet is an R—Fe—B-based alloy powder, an R—Fe—N-based alloy powder, or an R—Co-based alloy powder.

7. The thermoelectric conversion material according to claim 3, wherein the alloy powder for a rare earth magnet is an R—Fe—B-based alloy powder, an R—Fe—N-based alloy powder, or an R—Co-based alloy powder, and its average particle diameter is 5 to 500 µm.

8. A thermoelectric conversion material that is a composite of an alloy powder for a rare earth magnet, and a bismuth-based thermoelectric conversion material containing one or more dopants in an amount of no more than 5 at % in the bismuth, and has a coercive force $H_{cJ}$ of at least 79.6 kA/m.

9. The thermoelectric conversion material according to claim 8, wherein the bismuth-based thermoelectric conversion material is a material that exhibits n-type conduction and contains at least one group VI element, rare earth element, alkali metal element, or alkaline earth element in an amount of no more than 5 at % in the bismuth.

10. The thermoelectric conversion material according to claim 8, wherein the bismuth-based thermoelectric conversion material is a material that exhibits p-type conduction and contains at least one type of transition metal element, group III element, or group IV element in an amount of no more than 5 at % in the bismuth.

11. The thermoelectric conversion material according to claim 8, wherein the alloy powder for a rare earth magnet is an R—Fe—B-based alloy powder, an R—Fe—N-based alloy powder, or an R—Co-based alloy powder.

12. The thermoelectric conversion material according to claim 8, wherein the alloy powder for a rare earth magnet is an R—Fe—B-based alloy powder, an R—Fe—N-based alloy powder, or an R—Co-based alloy powder, and its average particle diameter is 5 to 500 µm.

13. A method for manufacturing a thermoelectric conversion material comprising the steps of:

mixing an alloy powder for a rare earth magnet with a bismuth-based thermoelectric conversion material containing one or more dopants in an amount of no more than 5 at % in the bismuth; and compounding this mixed powder by hot compression molding.

14. The method of manufacturing a thermoelectric conversion material according to claim 13, wherein the hot compression molding is carried out in a magnetic field.

15. The method for manufacturing a thermoelectric conversion material according to claim 13, wherein the hot compression molding is hot pressing or discharged plasma sintering.

16. A thermoelectric conversion element, comprising:

means for applying a magnetic field in the x axis direction of a thermoelectric conversion material containing one or more dopants in an amount of no more than 5 at % in bismuth, and thereby magnetizing this material;

means for imparting a temperature gradient $\nabla T$ in the z axis direction perpendicular to the magnetization direction; and means for attaching an electrode material on the high- and low-temperature sides in a plane in the y axis direction perpendicular to the above two directions, creating a p-n junction, and extracting thermoelectromotive force from the connection end.

* * * * *